(12) United States Patent
Chan

(10) Patent No.: US 8,094,214 B2
(45) Date of Patent: Jan. 10, 2012

(54) IMAGE SENSOR AND RELATED CDS CIRCUIT AND CDS LAYOUT METHOD

(75) Inventor: Jih-Wei Chan, Miao-Li County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 694 days.

(21) Appl. No.: 12/142,803

(22) Filed: Jun. 20, 2008

(65) Prior Publication Data
US 2009/0213248 A1 Aug. 27, 2009

(30) Foreign Application Priority Data
Feb. 21, 2008 (TW) .............................. 97106100 A

(51) Int. Cl.
*H04N 5/217* (2011.01)
*H04N 3/14* (2006.01)
(52) U.S. Cl. ...................................... 348/241; 348/308
(58) Field of Classification Search .................. 348/294, 348/241
See application file for complete search history.

(56) References Cited

U.S. PATENT DOCUMENTS

| 5,838,176 A * | 11/1998 | Delbruck et al. ............... 327/95 |
| 6,486,522 B1 | 11/2002 | Bishay |
| 7,030,918 B1 * | 4/2006 | Nakashiba ..................... 348/294 |
| 7,113,215 B2 * | 9/2006 | Kokubun ....................... 348/308 |
| 7,253,461 B2 * | 8/2007 | Yang et al. ..................... 257/292 |
| 7,595,827 B2 * | 9/2009 | Sato ............................... 348/296 |
| 7,919,827 B2 * | 4/2011 | Wu et al. ....................... 257/435 |
| 2008/0251823 A1 * | 10/2008 | Lee ............................... 257/292 |

FOREIGN PATENT DOCUMENTS

| JP | 2003273343 | 9/2003 |
| KR | 20030084344 | 11/2003 |
| WO | 2006109937 A1 | 10/2006 |

* cited by examiner

*Primary Examiner* — Ngoc-Yen Vu
(74) *Attorney, Agent, or Firm* — Winston Hsu; Scott Margo

(57) ABSTRACT

An image sensor capable of reducing noises includes a pixel array, a control circuit and a correlation double sampling (CDS) circuit array. The CDS circuit array is coupled between the pixel array and the control circuit, and includes a plurality of CDS circuit units, of which each CDS circuit unit includes a silicon substrate, a MOS device formed on the silicon substrate and connected to a voltage floating node of the CDS circuit unit, and a plurality of metal layers placed on the MOS device for providing electrical connection for the CDS circuit unit and for blocking light illumination on the MOS device.

16 Claims, 9 Drawing Sheets

US 8,094,214 B2

IMAGE SENSOR AND RELATED CDS CIRCUIT AND CDS LAYOUT METHOD

BACKGROUND OF THE INVENTION

1. Field of the Invention

The present invention relates to an image sensor and a related layout method thereof capable of reducing noises, and more particularly, to an image sensor and a related layout method of blocking light illumination on voltage floating nodes in correlation double sampling (CDS) circuits to avoid noise occurrences by properly arranging metal lines utilized for providing electrical connections for each node in the CDS circuits.

2. Description of the Prior Art

As the development of electronic products such as digital cameras and mobile phones progresses, the demand for image sensors increases accordingly. In general, image sensors are divided into two main categories: charge coupled device (CCD) sensors and CMOS image sensors (CIS). Primarily, CMOS image sensors have certain advantages of low operating voltages, low power consumption, and an ability for random access. Furthermore, CMOS image sensors are currently capable of integration with the semiconductor fabrication process. Based on those benefits, the application of CMOS image sensors has increased significantly.

Please refer to FIG. 1. FIG. 1 is a schematic diagram of a conventional CMOS image sensor 10. The CMOS image sensor 10 includes a pixel array 11, a correlation double sampling (CDS) circuit array 12, a row decoder 13, a column decoder 14 and an analog to digital converter 15. The pixel array 11 includes pixel units P11-Pmn arranged in a matrix form. Each of the pixel units P11-Pmn has a light-sensing region and a peripheral circuit region (not shown in FIG. 1.) The light-sensing region is utilized for sensing incident light and accumulating photo charges that are generated due to the incident light. The peripheral circuit region is utilized for properly outputting signals generated by the light-sensing region according to control signals of the row decoder 13 and the column decoder 14. The CDS circuit array 12 is arranged below the pixel array 11, and includes CDS circuits 120_1-120_n. Each CDS circuit 120 is individually coupled to a corresponding column of the pixel array 11, and is utilized for reading signals outputted from the corresponding column. The analog to digital converter 15 is arranged on a side of the pixel array 11, and is utilized for performing signal processing such as analog-to-digital conversion for signals outputted by the CDS circuits 120_1-120_n, successively.

As known by those skilled in the art, the peripheral circuit region of each pixel unit is formed by transistors, and thus photo charge signals outputted from each pixel unit may have fixed pattern noises (FPN) caused by transistor parameter differences between each pixel unit. Therefore, in the conventional CMOS image sensor, the CDS circuit array 12 is utilized for double sampling data signals (i.e. the photo charge signals) and reset signals outputted from each pixel unit, and the analog to digital converter 15 is further utilized for computing differences between the data signals and the reset signals, so as to prevent images being generated from having the fixed pattern noises induced by parameter differences of the transistors.

Please refer to FIG. 2. FIG. 2 is a schematic diagram of a CDS circuit 120 in FIG. 1. The CDS circuit 120 includes a switch 121, a sampling capacitor 122 and a buffer 123. The switch 121 is utilized for switching data signals or reset signals received from the pixel array 11 according to the control signal outputted by the column decoder 14. The sampling capacitor 122 is coupled to the switch 121, and is utilized for storing the data signals or the reset signals received through the switch 121. The buffer 123 is coupled to a node A, and is utilized for outputting a voltage of the node A to the analog to digital converter 15 according to the control signal outputted by the column decoder 14. Thus, after the CDS circuit 120 completes the reception of the data signals or the reset signals, the switch 120 is turned off for allowing the analog to digital converter 15 to successively read out voltages kept in the sampling capacitor 122 of each CDS circuit 120.

At this time, the voltages kept in the CDS circuit 120 cannot be interfered with by external noises before being read out by the analog to digital converter 15. However, the node A is possessed of a voltage floating property when the switch 121 is turned off, so the node A is often labeled as "a floating node" by those skilled in the art.

However, photo-electric effects are easily generated when light illuminating on the floating node A, so as to change the voltages kept by the sampling capacitor 122 and further induce noises. Besides, depending on locations of each CDS circuit 120 in the CDS circuit array 12, angles and amplitudes of light illuminating on each CDS circuit 120 are different as well as extents to which they are interfered with by the noises. In this case, the use of the CDS circuits is not effective for reducing image noises, which further influences performance of the CMOS image sensor.

In the prior art, photoresist or metal blocks are generally utilized for blocking light illumination on the peripheral circuit regions of the CMOS image sensor to further reduce noise interferences caused by optical energy. However, the photoresist cannot effectively insulate light incidence, and the use of metal blocks is greatly limited due to cost concern and circuit dimensions.

SUMMARY OF THE INVENTION

It is therefore an objective of the present invention to provide an image sensor and related method thereof capable of reducing noises.

According to the present invention, an image sensor capable of reducing noises is disclosed. The image sensor comprises a pixel array; a control circuit; and a correlation double sampling (CDS) circuit array. The CDS circuit array is coupled between the pixel array and the control circuit, and comprises a plurality of CDS circuit units. Each of the plurality of CDS circuit units further comprises a silicon substrate; a MOS device formed on the silicon substrate and connected to a floating node of the CDS circuit unit; and a plurality of metal layers, arranged on the MOS device, for providing electrical connection for the CDS circuit unit and blocking light illumination on the MOS device.

According to the present invention, a correlation double sampling (CDS) circuit is further disclosed. The CDS circuit comprises a silicon substrate; a MOS device formed on the silicon substrate and connected to a floating node of the CDS circuit unit; and a plurality of metal layers, arranged on the MOS device, for providing electrical connection for the CDS circuit unit and blocking light illumination on the MOS device.

According to the present invention, a layout method of correlation double sampling (CDS) circuits of an image sensor is further disclosed. The layout method comprises the steps of arranging a MOS device of a CDS circuit on a silicon substrate, the MOS device being connected to a floating node of the CDS circuit; and arranging a plurality of metal connecting lines in a plurality of metal layers for providing electrical connection for the CDS circuit unit and blocking light illumination on the MOS device according to a location of the CDS circuit in a CDS circuit array.

According to the present invention, an image sensor capable of reducing noises is further disclosed. The image sensor comprises a pixel array; a control circuit and a correlation double sampling (CDS) circuit array. The CDS circuit array is coupled between the pixel array and the control circuit, and comprises a plurality of CDS circuit units. The plurality of CDS circuit units at least comprises a first CDS circuit unit and a second CDS circuit unit. The first CDS circuit comprises a first silicon substrate; a first MOS device formed on the first silicon substrate and connected to a floating node of the first CDS circuit unit; and a first plurality of metal layers, arranged on the first MOS device, for providing electrical connection for the first CDS circuit unit and forming a first circuit pattern on the first MOS device for blocking light illumination on the first MOS device. The second CDS circuit unit comprises a second silicone substrate; a second MOS device formed on the second silicon substrate and connected to a floating node of the second CDS circuit unit; and a second plurality of metal layers, arranged on the first MOS device, for providing electrical connection for the second CDS circuit unit and forming a second circuit pattern on the second MOS device for blocking light illumination on the second MOS device. The first CDS circuit unit and the second CDS circuit unit are adjacent circuit units of the CDS circuit array, and the first circuit pattern and the second circuit pattern are not completely the same.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
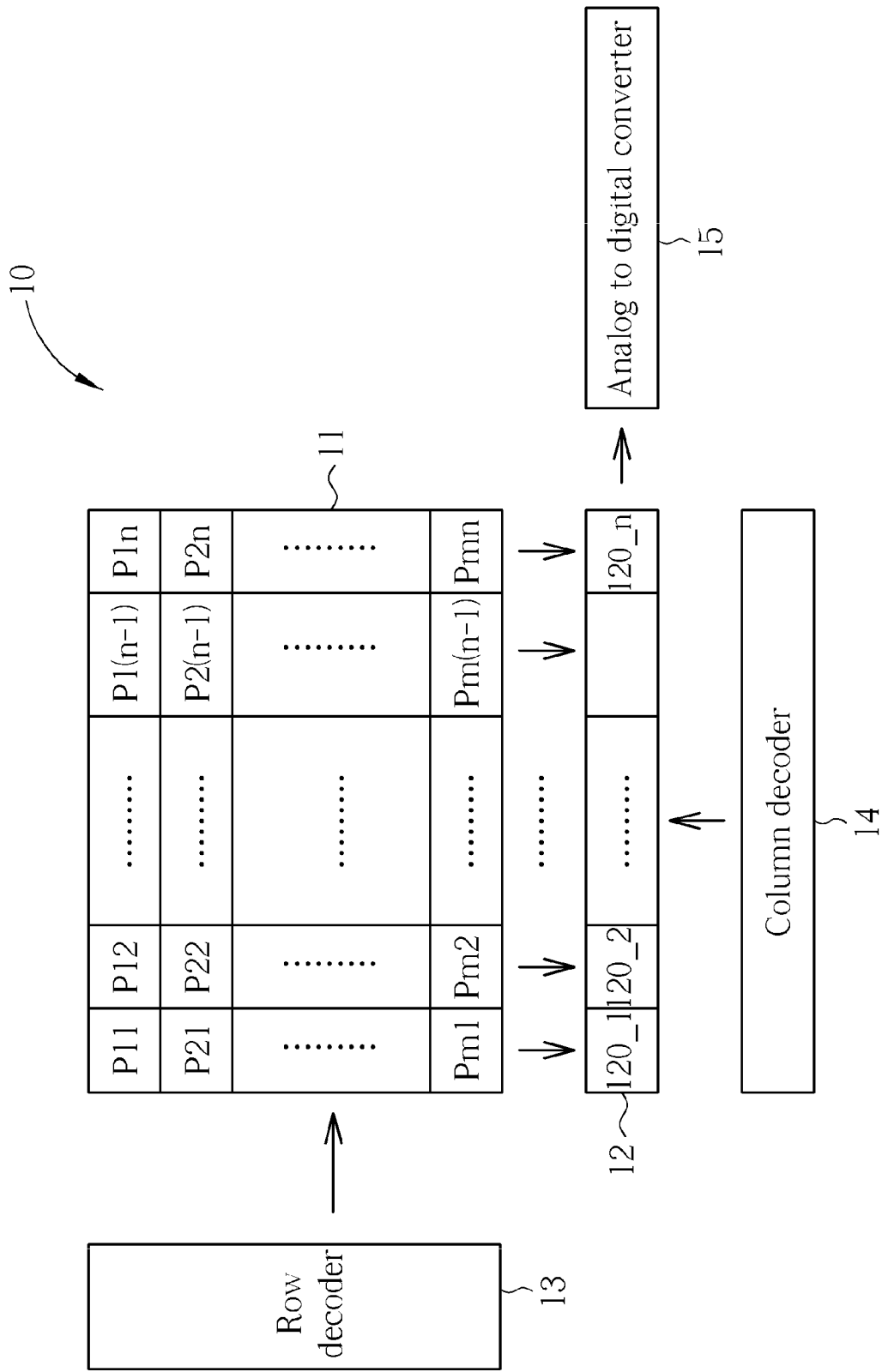
FIG. 1 is a schematic diagram of a conventional CMOS image sensor.
Figure 2:
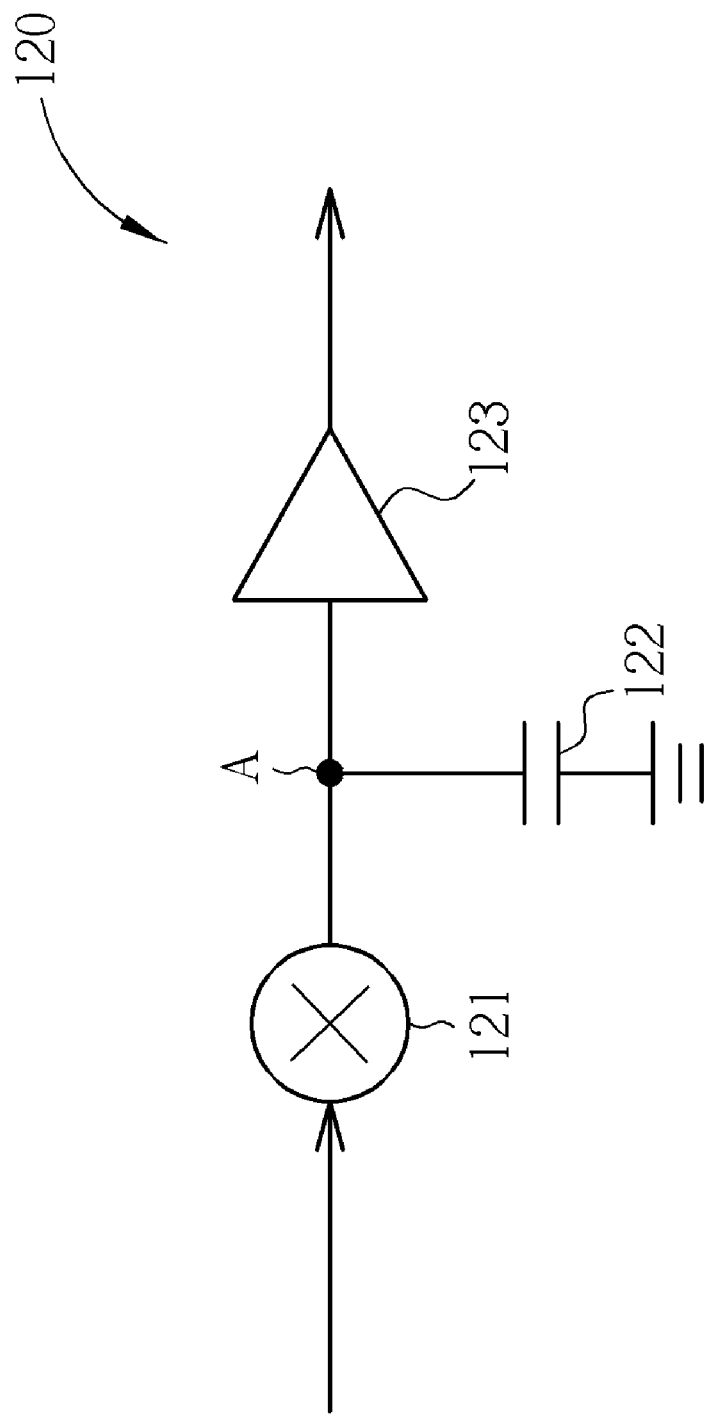
FIG. 2 is a schematic diagram of a CDS circuit in FIG. 1.
Figure 3:
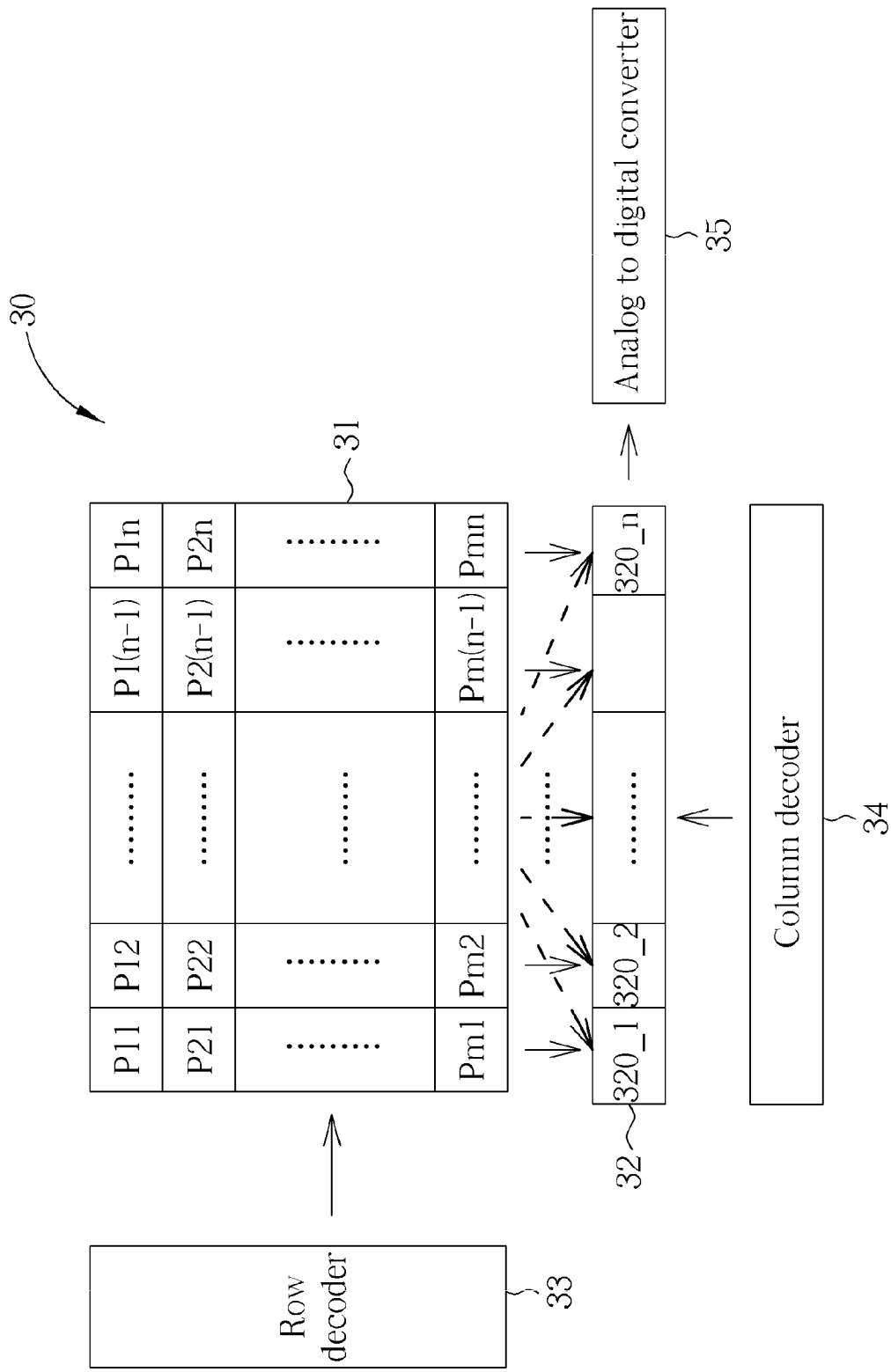
FIG. 3 is a schematic diagram of a CMOS image sensor of the present invention.

Please refer to FIG. 3. FIG. 3 is a schematic diagram of a CMOS image sensor 30 of the present invention. The CMOS image sensor 30 includes a pixel array 31, a correlation double sampling (CDS) circuit array 32, a row decoder 33, a column decoder 34 and an analog to digital converter 35. The pixel array 31, the row decoder 33, the column decoder 34 and the analog to digital converter 35 are similar to that of the CMOS image sensor 10 in FIG. 1, and thus are not narrated again. The CDS circuit array 32 is arranged below the pixel array 11, and includes CDS circuits 320_1 to 320_n. Interior circuit of each CDS circuit is similar to that of the CDS circuit 120 shown in FIG. 2, and is also not narrated again herein.

Since each CDS circuit 320 is located differently from each other in the CDS circuit array 32, angles and amplitudes of light illuminating on each CDS circuit 320 are also different, which is shown as dashed arrows in FIG. 3.

Generally speaking, there are many voltage floating nodes in the CDS circuit 320, such as the floating node A shown in FIG. 2, and thus noises are easily generated when light illuminating on the floating nodes due to photo-electric effects. In addition, depending on locations of each CDS circuit 320 in the CDS circuit array 32, angles and amplitudes of light illuminating on each CDS circuit are different, so that noises generated by the photo-electric effects also cause different extent interferences for each CDS circuit. Therefore, in the present invention, layouts of each CDS circuit are appropriately adjusted for reducing image noises of the CMOS image sensor according to the locations of each CDS circuit 320 in the CDS circuit array 32.

Figure 4:
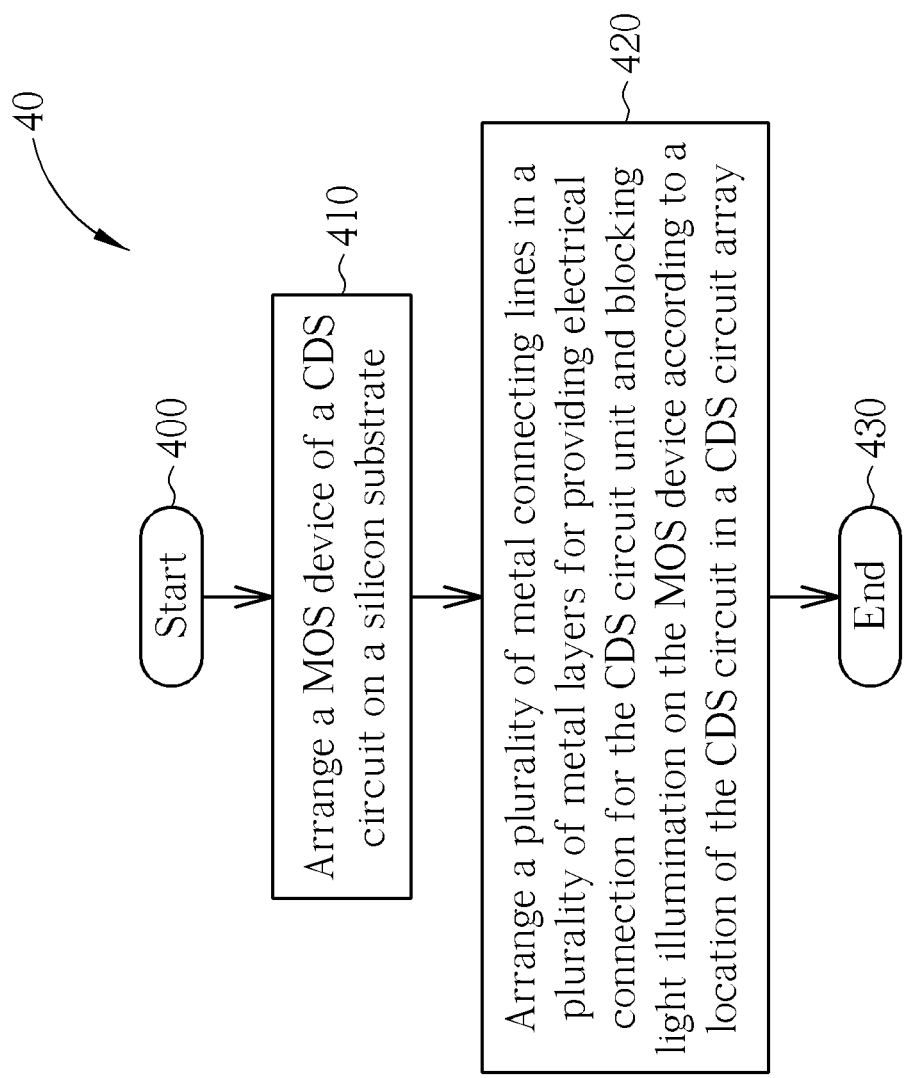
FIG. 4 is a schematic diagram of a layout process of the present invention.

Please refer to FIG. 4. FIG. 4 is a schematic diagram of a layout process 40 of the present invention. The layout process 40 is utilized for realizing the CDS circuits 320_1 to 320_n of the CMOS image sensor, and includes the following steps:

Step 400: Start.
Step 410: Arrange a MOS device of a CDS circuit on a silicon substrate.
Step 420: Arrange a plurality of metal connecting lines in a plurality of metal layers for providing electrical connection for the CDS circuit unit and blocking light illumination on the MOS device according to a location of the CDS circuit in a CDS circuit array.
Step 430: End.

According to the process 40, when performing circuit layout of the CDS array 32, the present invention firstly arranges the MOS device of the CDS circuit on the silicon substrate, where the MOS device is connected to a floating node in the CDS circuit. Next, the present invention arranges a plurality of metal connecting lines in a plurality of metal layers for providing electrical connections for the CDS circuit and blocking light illumination on the floating node connected with the MOS device according to the location of the CDS circuit in the CDS circuit array.

Preferably, the MOS device can be a sampling capacitor, a switch element or a buffer component of the CDS circuit unit. That is to say, in the present invention, the metal connecting lines utilized for providing electrical connections between each node in the CDS circuit can be appropriately arranged for blocking light illumination on the voltage floating nodes in the CDS circuit, so as to prevent noise occurrences caused by the photo-electric effects.

Figure 5:
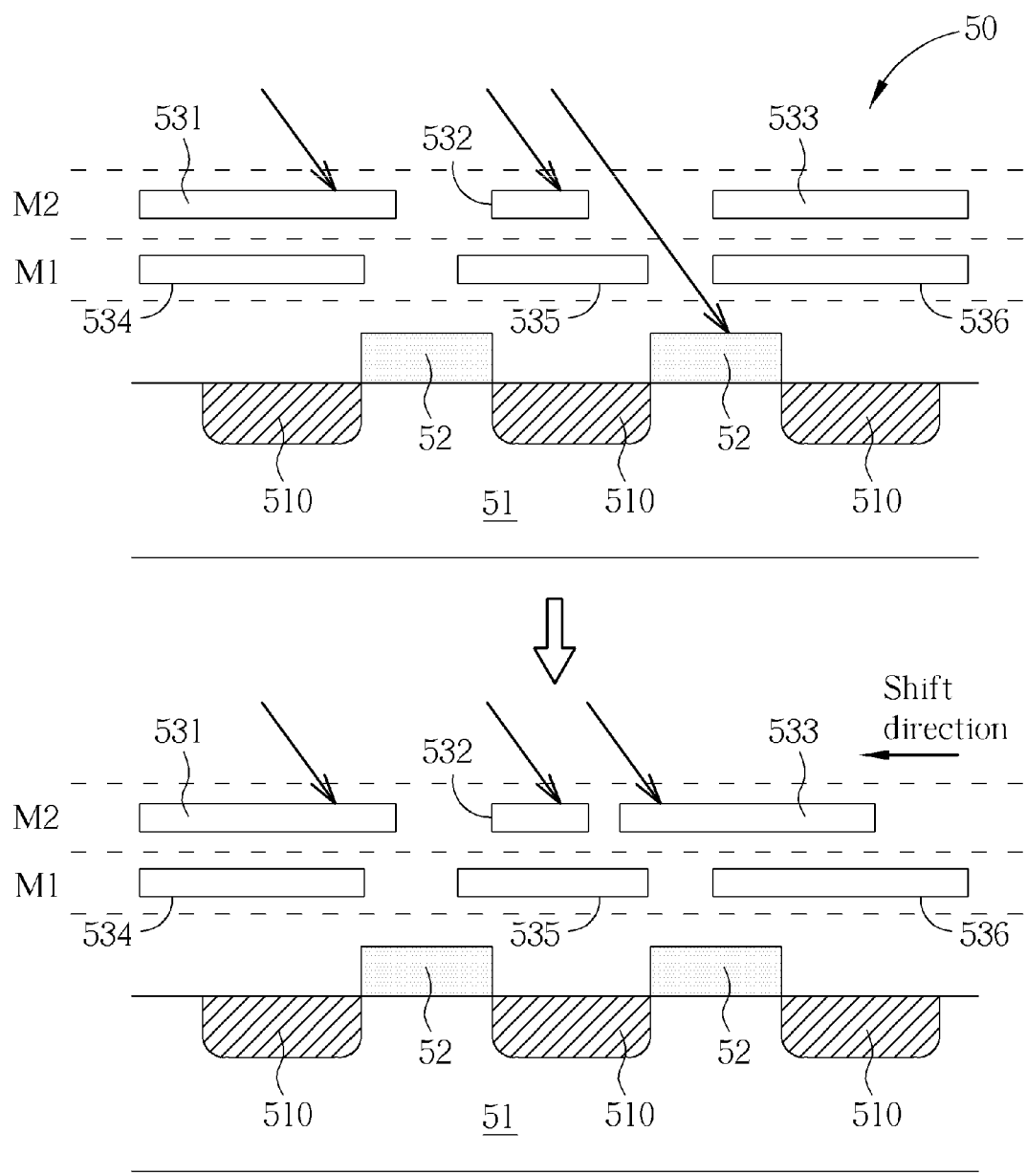
FIG. 5 is a cross-section diagram of a CDS circuit according to an embodiment of the present invention.

For example, please refer to FIG. 5. FIG. 5 is a cross-section diagram of a CDS circuit 50 according to an embodiment of the present invention. The CDS circuit 50 is preferably located at a right side of the CDS circuit array 32 in FIG. 3 (ex. the CDS circuit 320_n), and includes a silicon substrate 51, a polysilicon gate 52 and metal layers M1 and M2. The silicon substrate 51 has a doping area 510. The polysilicon gate 52 is arranged on the doping area 510 of the silicon substrate 51, and is utilized for forming a MOS device of the CDS circuit 50 with the silicon substrate 51. The metal layers M1 and M2 are arranged above the polysilicon gate 52, and are utilized for forming metal connecting lines 531 to 536 to provide electrical connections for the CDS circuit 50 and block light illumination on floating nodes in the CDS circuit according to a location of the CDS circuit 50 in the CDS circuit array.

In this embodiment, since the CDS circuit 50 is located at the right side of the CDS circuit array 32, incident light mainly comes from an upper left side of the CDS circuit 50.

Thus, in the present invention, the metal connecting line 533 of the metal layer M2 can be performed an appropriate leftward shift for blocking light illumination on the MOS device (i.e. the polysilicon gate 52), so as to prevent noise occurrences. Preferably, when performing circuit layout of the CMOS image sensor, measures like computing incident light angles by computer programs can be utilized for determining the distance of the metal connecting line 533 needed to be shifted. Please note that, shifting the metal connecting line 533 of the metal layer 52 is merely an exemplary illustration of the present invention, and those skilled in the art can further shift the metal connecting lines 534 to 536 of the metal layer M1 according to practical demands, which are not restricted herein.

Note that, in the present invention, locations of the above-mentioned metal layer M1 and M2 are not restricted. M1 and M2 are only used for exemplifying the metal layers but are not limitations, and the designer can use any number of metal layers for the deployment of the metal layers M1 and M2 in practical applications.

Figure 6:
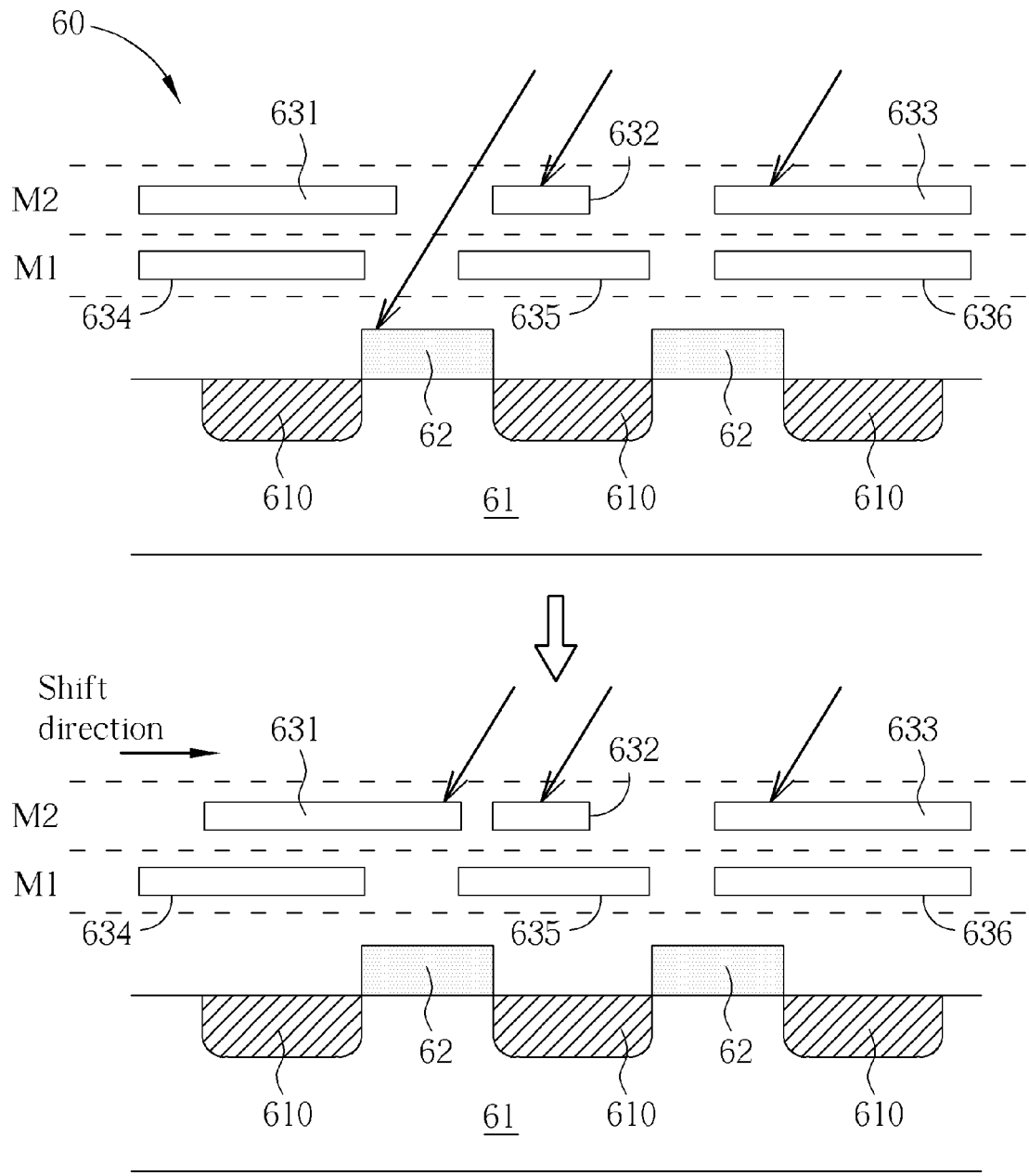
FIG. 6 is a cross-section diagram of a CDS circuit according to another embodiment of the present invention.

Conversely, please refer to FIG. 6. FIG. 6 is a cross-section diagram of a CDS circuit 60 according to another embodiment of the present invention. The structure of the CDS circuit 60 is similar to that of the CDS circuit 50 in FIG. 5, and is not narrated again. In this embodiment, the CDS circuit 60 is preferably located at a left side of the CDS circuit array 32 in FIG. 3 (ex. the CDS circuit 320_1), and incident light mainly comes from an upper right side of the CDS circuit 60 (as shown in FIG. 3). Thus, when the circuit layout is performed, an appropriate rightward shift can be performed on the metal connecting line 631 of the metal layer M2 for blocking light illumination on the MOS device (i.e. the polysilicon gate 62), so as to prevent noise occurrences.

Figure 7:
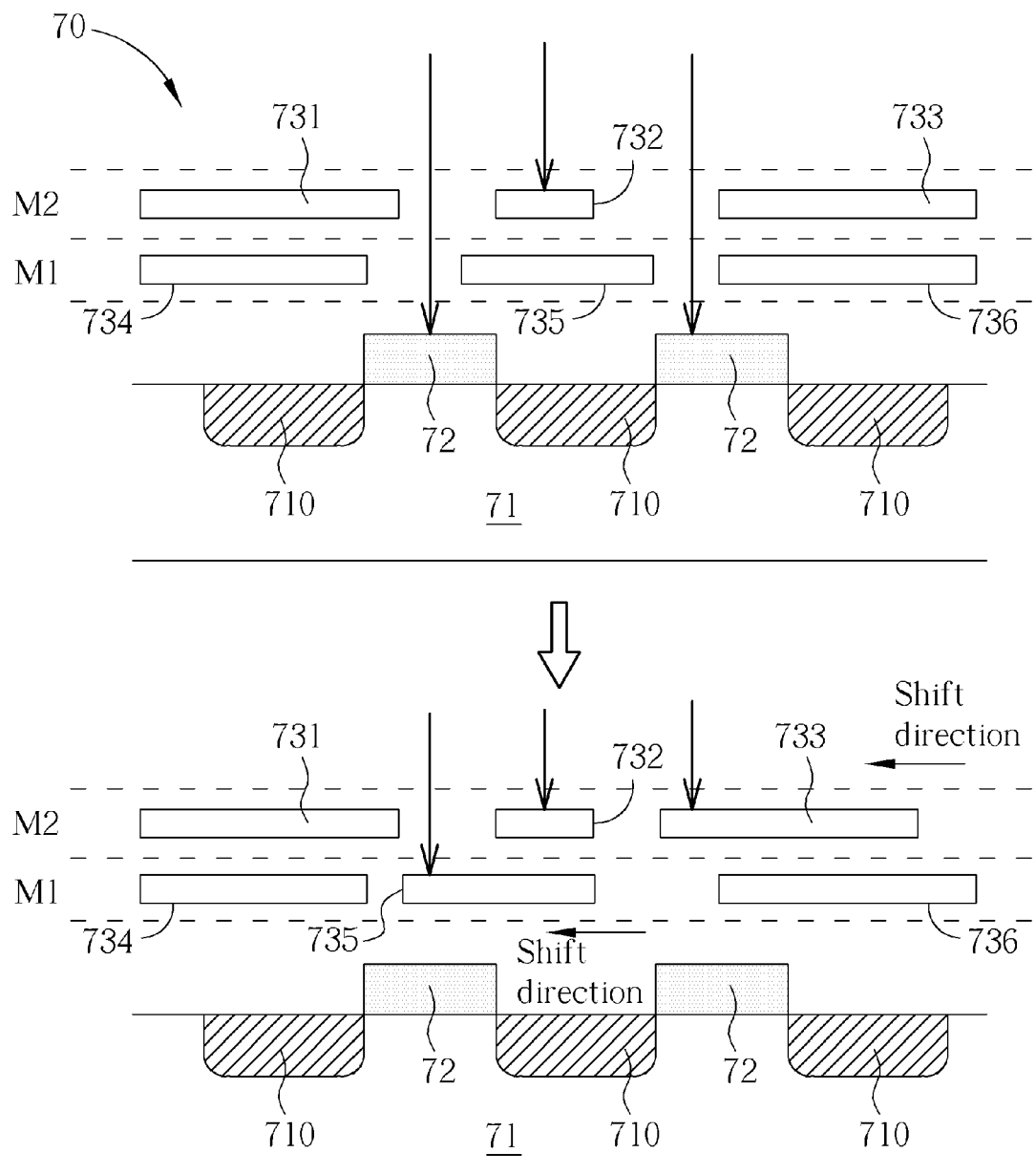
FIG. 7 is a cross-section diagram of a CDS circuit according to another embodiment of the present invention.

Please further refer to FIG. 7. FIG. 7 is a cross-section diagram of a CDS circuit 70 according to another embodiment of the present invention. The structure of the CDS circuit 70 is similar to that of the CDS circuit 50 in FIG. 5, and is not narrated again. In this embodiment, the CDS circuit 70 is preferably located at the middle of the CDS circuit array 32 in FIG. 3, and thus incident light may project on the CDS circuit 70 vertically. In this case, the metal connecting lines 731 to 736 of the metal layers M1 and M2 can be shifted leftwards or rightwards for blocking light illumination on the MOS device.

Please not that the above-mentioned floating nodes of the CDS circuit are not limited to the MOS devices, any nodes that are electrically sensitive to the light irradiation all belong to the scope of the present invention. For example, in the above FIG. 5 to FIG. 7, the purpose of shifting the metal layer M2 is to block light illumination on the gate electrodes of the MOS devices. However, in practical applications, the designer can use the upper metal layers to block light illumination on any portions of the MOS devices, such as source of drain electrodes of the MOS devices, and such corresponding variations all belong to the scope of the present invention. In addition, as mentioned above, the MOS device shown in FIG. 5 to FIG. 7 can be a sampling capacitor, a switch element or a buffer component of the MOS device.

Figure 8:
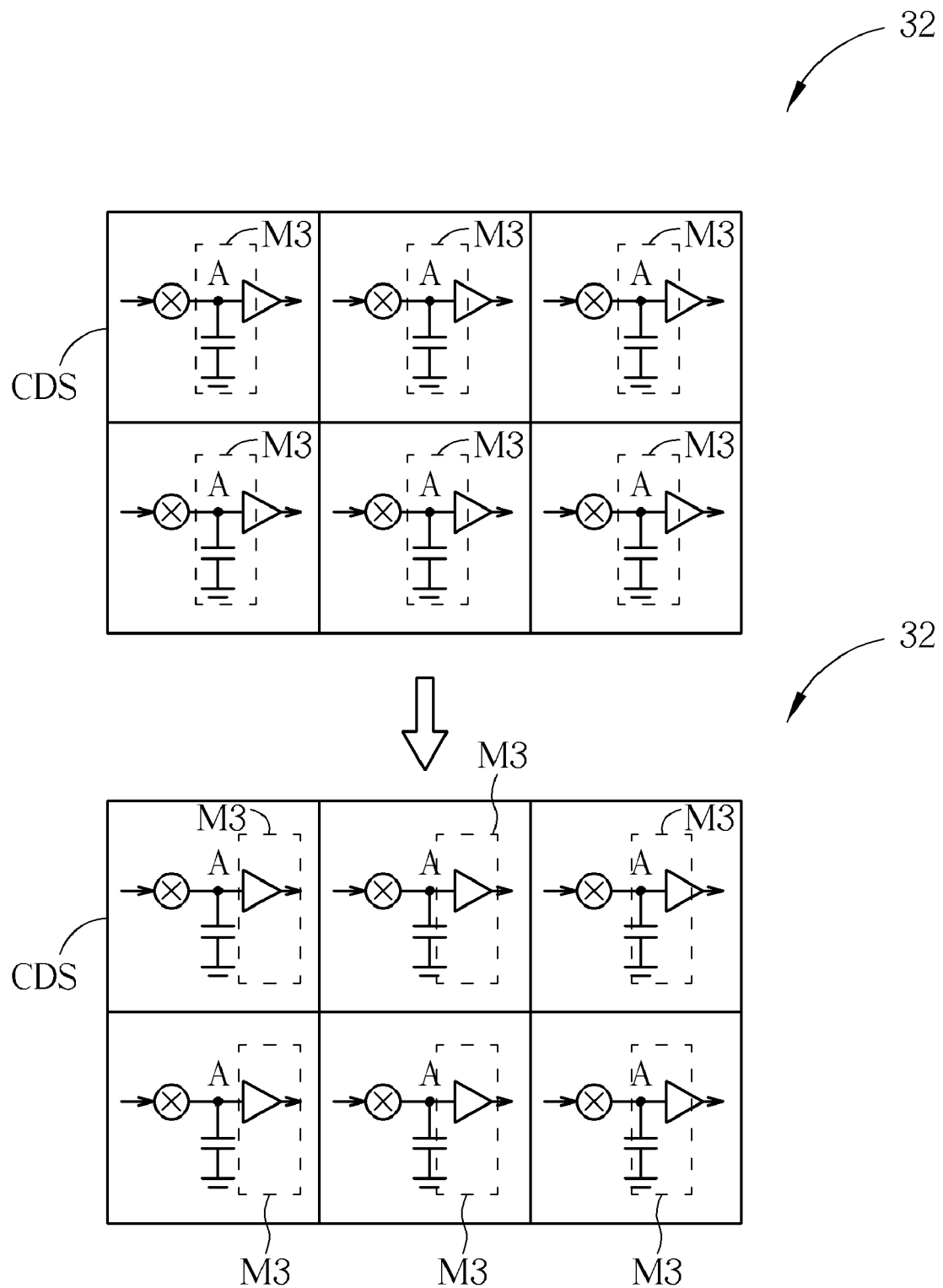
FIG. 8 and FIG. 9 are top view diagrams of an embodiment of the CDS circuit array in FIG. 3.
Figure 9:
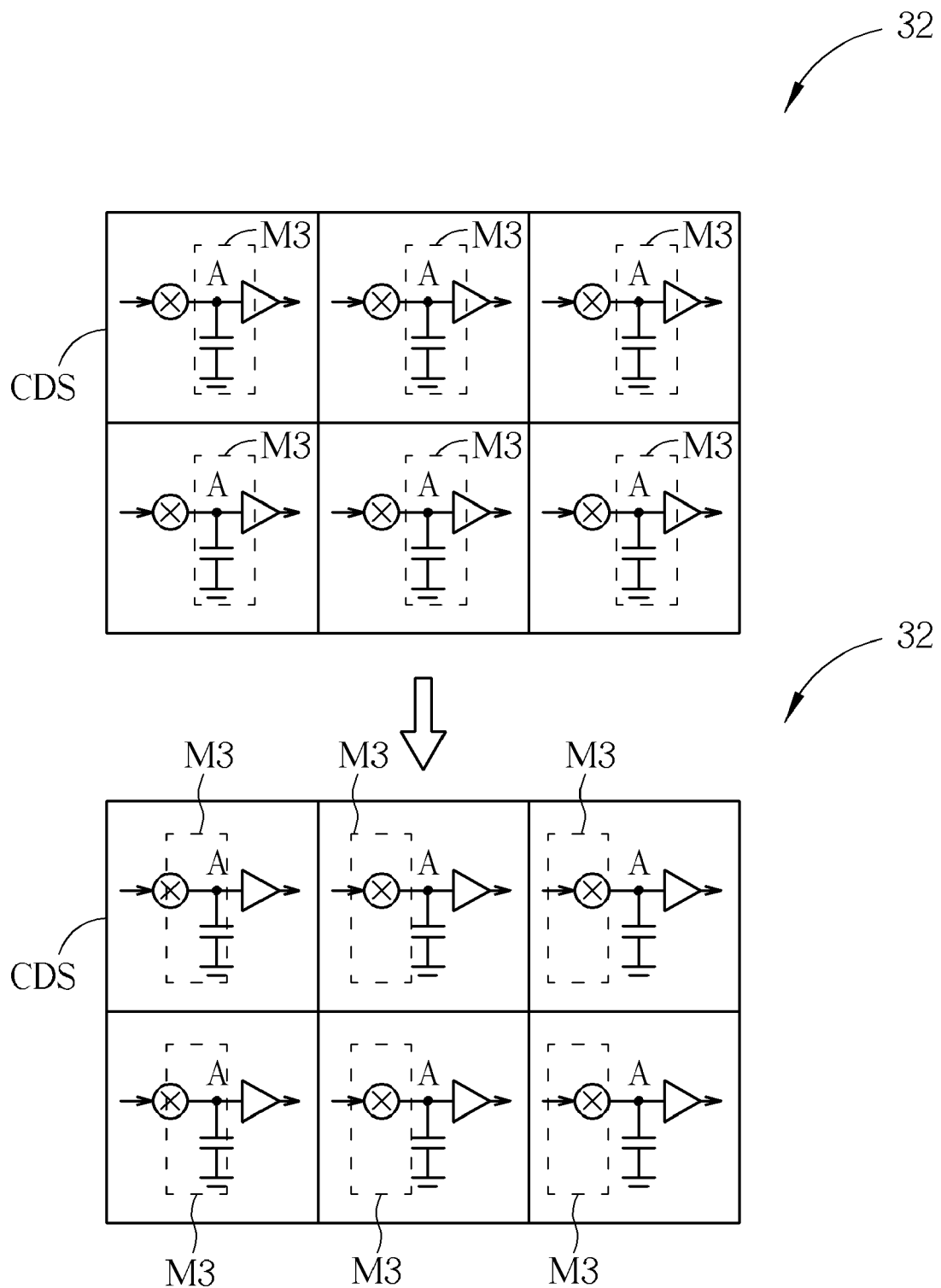

Therefore, please refer to FIG. 8 and FIG. 9. FIG. 8 and FIG. 9 are top view diagrams of embodiments of the CDS circuit array 32 in FIG. 3. FIG. 8 and FIG. 9 respectively represent CDS circuit units located at the left side (ex. around the CDS circuit 320_1) and the right side (ex. around the CDS circuit 320_n) of the CDS circuit array 32. For convenience, FIG. 8 and FIG. 9 only shows layout of one metal layer in the CDS circuit array 32. Upper half parts of FIG. 8 and FIG. 9 represent layout patterns of metal connecting lines M3 without being performed by the layout process of the present invention, but lower half parts of FIG. 8 and FIG. 9 represent layout results performed after the layout process of the present invention. Since angles and amplitudes of light projecting on each CDS circuit in the CDS circuit array 32 are different, the present invention can adjust locations of the metal connecting lines M3 in each CDS circuit unit for blocking light illumination on voltage floating nodes of each CDS circuit unit (represented by nodes A) according to the angles of the incident light when performing circuit layout process. In FIG. 8, since each CDS circuit unit is located at the left side of the CDS circuit array 32, incident light mainly comes from the upper right side of each CDS circuit unit, so that the metal connecting lines M3 can be shifted rightwards to block light illumination on the floating nodes A connected with the MOS devices. Similarly, in FIG. 9, since each CDS circuit unit is located at the right side of the CDS circuit array 32, incident light mainly comes from the upper left side of each CDS circuit unit, so that the metal connecting lines M3 can be shifted leftwards to block light illumination on the floating nodes A connected with the MOS devices. Apparently, the layout patterns of the metal connecting lines M3 are different in each CDS circuit unit even if functions are completely the same.

As mentioned above, the present invention appropriately arranges the metal connecting lines, utilized for providing electrical connections between each node in the CDS circuits, to block light illumination on the voltage floating nodes of the CDS circuits according to the locations of each CDS circuit in the CDS circuit array. Therefore, the present invention can prevent noise occurrences induced by the photoelectric effects for further enhancing the CMOS image sensor performance.

Those skilled in the art will readily observe that numerous modifications and alterations of the device and method may be made while retaining the teachings of the invention.

What is claimed is:

1. An image sensor capable of reducing noises comprising:
   a pixel array;
   a control circuit; and
   a correlation double sampling (CDS) circuit array, coupled between the pixel array and the control circuit, comprising a plurality of CDS circuit units, each of the plurality of CDS circuit units comprising:
   a silicon substrate;
   a MOS device formed on the silicon substrate and connected to a floating node of the CDS circuit unit; and
   a plurality of metal layers, arranged on the MOS device, for providing electrical connection for the CDS circuit unit and forming a circuit pattern on the MOS device for blocking light illumination on the MOS device;
   wherein the circuit pattern varies according to a location of the each CDS circuit unit in the CDS circuit array.

2. The image sensor of claim 1, wherein the MOS device is a sampling capacitor of the CDS circuit unit.

3. The image sensor of claim 1, wherein the MOS device is a switch of the CDS circuit unit.

4. The image sensor of claim 1, wherein the MOS device is a component of a buffer of the CDS circuit unit.

5. The image sensor of claim 1, wherein the circuit pattern of the plurality of metal layers corresponds to the location of the MOS device for blocking light illumination on the MOS device.

6. A correlation double sampling (CDS) circuit for an image sensor comprising:

a silicon substrate;
a MOS device formed on the silicon substrate and connected to a voltage floating node of the CDS circuit unit; and
a plurality of metal layers, arranged on the MOS device, for providing electrical connection for the CDS circuit unit and forming a circuit pattern on the MOS device for blocking light illumination on the MOS device;
wherein the circuit pattern varies according to a location of the CDS circuit.

7. The CDS circuit of claim 6, wherein the MOS device is a sampling capacitor of the CDS circuit unit.

8. The CDS circuit of claim 6, wherein the MOS device is a switch of the CDS circuit unit.

9. The CDS circuit of claim 6, wherein the MOS device is a component of a buffer of the CDS circuit unit.

10. The CDS circuit of claim 6, wherein the circuit pattern of the plurality of metal layers corresponds to the location of the MOS device for blocking light illumination on the MOS device.

11. A layout method of correlation double sampling (CDS) circuits of an image sensor comprising:
arranging a MOS device of a CDS circuit on a silicon substrate, the MOS device being connected to a floating node of the CDS circuit; and
arranging a plurality of metal connecting lines in a plurality of metal layers for providing electrical connection for the CDS circuit unit and forming a circuit pattern on the MOS device for blocking light illumination on the MOS device according to a location of the CDS circuit in a CDS circuit array;
wherein the circuit pattern varies according to a location of the CDS circuit.

12. The layout method of claim 11, wherein the MOS device is a sampling capacitor of the CDS circuit unit.

13. The layout method of claim 11, wherein the MOS device is a switch of the CDS circuit unit.

14. The layout method of claim 11, wherein the MOS device is a component of a buffer of the CDS circuit unit.

15. The layout method of claim 11, wherein patterns of the plurality of metal layers correspond to the location of the MOS device for blocking light illumination on the MOS device.

16. An image sensor capable of reducing noises comprising:
a pixel array;
a control circuit; and
a correlation double sampling (CDS) circuit array, coupled between the pixel array and the control circuit, comprising a plurality of CDS circuit units, the plurality of CDS circuit units at least comprising:
a first CDS circuit unit comprising:
a first silicon substrate;
a first MOS device formed on the first silicon substrate and connected to a floating node of the first CDS circuit unit; and
a first plurality of metal layers, arranged on the first MOS device, for providing electrical connection for the first CDS circuit unit and forming a first circuit pattern on the first MOS device for blocking light illumination on the first MOS device; and
a second CDS circuit unit comprising:
a second silicone substrate;
a second MOS device formed on the second silicon substrate and connected to a floating node of the second CDS circuit unit; and
a second plurality of metal layers, arranged on the first MOS device, for providing electrical connection for the second CDS circuit unit and forming a second circuit pattern on the second MOS device for blocking light illumination on the second MOS device;
wherein the first CDS circuit unit and the second CDS circuit unit are adjacent circuit units of the CDS circuit array and the first circuit pattern and the second circuit pattern are not completely the same.

\* \* \* \* \*